United States Patent
Yamaguchi

(10) Patent No.: US 9,948,276 B2
(45) Date of Patent: Apr. 17, 2018

(54) HIGH-FREQUENCY MODULE

(71) Applicant: Murata Manufacturing Co., Ltd., Nagaokakyo-shi, Kyoto-fu (JP)

(72) Inventor: Yukiya Yamaguchi, Nagaokakyo (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 15/428,252

(22) Filed: Feb. 9, 2017

(65) Prior Publication Data

US 2017/0155376 A1    Jun. 1, 2017

Related U.S. Application Data

(63) Continuation of application No. PCT/JP2015/072604, filed on Aug. 10, 2015.

(30) Foreign Application Priority Data

Aug. 12, 2014    (JP) ................ 2014-164030

(51) Int. Cl.
| | |
|---|---|
| H04B 1/38 | (2015.01) |
| H03H 9/64 | (2006.01) |
| H03H 9/72 | (2006.01) |
| H03H 7/38 | (2006.01) |
| H04B 1/40 | (2015.01) |
| H04W 88/02 | (2009.01) |

(52) U.S. Cl.
CPC ........... *H03H 9/64* (2013.01); *H03H 7/38* (2013.01); *H03H 9/725* (2013.01); *H04W 88/02* (2013.01)

(58) Field of Classification Search
CPC .. H03H 9/0085; H03H 9/0566; H03H 9/0576; H03H 9/0577; H03H 9/25; H03H 9/725

USPC ............................................ 455/73; 333/100
See application file for complete search history.

(56) References Cited

U.S. PATENT DOCUMENTS

| | | | |
|---|---|---|---|
| 2009/0174497 A1 | 7/2009 | Korden | |
| 2015/0180447 A1 | 6/2015 | Okuda | |

FOREIGN PATENT DOCUMENTS

| | | |
|---|---|---|
| JP | 2002-217680 A | 8/2002 |
| JP | 2003-008393 A | 1/2003 |

(Continued)

OTHER PUBLICATIONS

Official Communication issued in corresponding International Application PCT/JP2015/072604, dated Sep. 1, 2015.

(Continued)

*Primary Examiner* — Lee Nguyen
(74) *Attorney, Agent, or Firm* — Keating & Bennett, LLP

(57) ABSTRACT

In a high-frequency module, first and second inductors that adjust attenuation characteristics of a first filter of a filter component, are separated from each other such that the first and second inductors readily magnetic field couple with each other. Consequently, an amount of wiring used to define a first wiring electrode inside the filter component is reduced and a number of layers of a package substrate and the profile of the filter component are reduced. Consequently, variations in the attenuation characteristics of the first filter caused by the first wiring electrode electromagnetic-field coupling with another wiring electrode are prevented. The attenuation characteristics of the first filter is easily adjusted and improved by adjusting the inductance value of the second inductor.

20 Claims, 5 Drawing Sheets

(56) References Cited

FOREIGN PATENT DOCUMENTS

JP      2009-544201 A    12/2009
WO      2014/045726 A1   3/2014

OTHER PUBLICATIONS

English translation of Official Communication issued in corresponding Japanese Patent Application No. 2015-560473, dated Feb. 9, 2016.

US 9,948,276 B2

HIGH-FREQUENCY MODULE

CROSS REFERENCE TO RELATED APPLICATIONS

This application claims the benefit of priority to Japanese Patent Application No. 2014-164030 filed on Aug. 12, 2014 and is a Continuation Application of PCT Application No. PCT/JP2015/072604 filed on Aug. 10, 2015. The entire contents of each application are hereby incorporated herein by reference.

BACKGROUND OF THE INVENTION

1. Field of the Invention

The present invention relates to a high-frequency module that includes a module substrate on which a filter component is mounted.

2. Description of the Related Art

To date, high-frequency modules have been proposed that include a module substrate on which a filter component is mounted. A filter component having a chip size package (CSP) structure that includes a filter substrate that includes a plurality of resonators, which define a filter, provided on one main surface thereof and a package substrate on which the filter substrate is mounted; and a filter component having a wafer level chip size package (WL-CSP) structure in which a filter substrate on which a filter is provided is directly mounted on a module substrate have been proposed as examples of such a filter component that is mounted on a module substrate.

Furthermore, in such a filter component, generally, an inductor is mounted that is for adjusting the characteristics of a filter that is formed of resonators that utilize elastic waves. For example, in a CSP-structure filter component, as illustrated in FIG. 7, inductors La and Lb are provided in a package substrate 500. The package substrate 500 is formed by stacking a plurality of insulating layers 501 to 504 on top of one another and a filter substrate (not illustrated) is mounted in an area 505 enclosed by a dotted line on one main surface of the insulating layer 504. In addition, first and second terminals 506 and 507, through which an RF signal is input and output to and from a module substrate on which the filter component is mounted, and third terminals 508 that are connected to ground electrodes of the module substrate are formed on the other main surface of the insulating layer 501.

Furthermore, in the example illustrated in FIG. 7, a plurality of series-arm resonators that are arranged in a series arm connected between input/output terminals of the filter and two parallel arm resonators, one end of each of which is connected to the series arm, are formed on the filter substrate. The input/output terminals of the filter are connected to wiring electrodes 509 and 510, which are for extracting an RF signal, and are connected to the first and second terminals 506 and 507 via interlayer connection conductors 511.

In addition, the other end of one of the parallel arm resonators is connected to a ground wiring electrode 512 that is formed on the one main surface of the insulating layer 504, and is connected, via interlayer connection conductors 513, to a wiring electrode 514 that is formed on one main surface of the insulating layer 503 and forms the inductor La, to a ground wiring electrode 515 that is formed on one main surface of the insulating layer 502, and to the third terminal 508. Furthermore, the other end of the other parallel arm resonator is connected to a ground wiring electrode 516 that is formed on the one main surface of the insulating layer 504 and is connected, via interlayer connection conductors 517, to a wiring electrode 518 that is formed on the one main surface of the insulating layer 503 and forms the inductor Lb, to the wiring electrode 515, and to the third terminal 508.

The inductor characteristics of the inductors La and Lb can be adjusted by changing the pattern shapes, the line lengths and the thicknesses of the wiring electrodes 514 and 518.

In the example illustrated in FIG. 7, the inductors La and Lb, which adjust the characteristics of the filter, are arranged inside the package substrate 500 of the filter component. Consequently, there is a problem in that the insulating layer 503 is necessary for arranging the wiring electrodes 514 and 518 that form the inductors La and Lb and the thickness of the filter component (package substrate 500) mounted on the module substrate is increased.

Furthermore, if the line lengths of the wiring electrodes 514 and 518, which are for forming the inductors La and Lb, are increased and another wiring electrode is additionally formed in order to form another characteristics-adjusting inductor without increasing the size of the package substrate 500 so as to not increase the size of the filter component, there is a risk that the following problem will occur. That is, the wiring density, inside the package substrate 500, of the wiring electrodes 514 and 518, which are for forming the characteristics-adjusting inductors La and Lb, is increased and the wiring electrodes 514 and 518 are arranged closer to each other.

Therefore, the wiring electrodes 514 and 518 electromagnetic-field couple with each other and, for example, an unwanted capacitance component is generated therebetween and consequently, there is a risk that the attenuation characteristics of the filter will vary. In addition, since the space in which to arrange the wiring electrodes 514 and 518 for forming the inductors La and Lb inside the package substrate 500 is limited, there is a problem in that it is difficult to adjust the attenuation characteristics of the filter by adjusting the inductance values of the inductors La and Lb by changing the pattern shapes, the line lengths and the thicknesses of the inductors La and Lb.

SUMMARY OF THE INVENTION

Preferred embodiments of the present invention provide a technology that prevents variations in attenuation characteristics of a filter and that is able to easily adjust and improve the attenuation characteristics of the filter while reducing the profile of a filter component.

A high-frequency module according to a preferred embodiment of the present invention includes a filter component including a first terminal to which an RF signal is input, a first filter through which the RF signal input to the first terminal passes, a second terminal that outputs the RF signal that has passed through the first filter, a third terminal, and a first inductor including one end connected to the first filter and another end connected to the third terminal; a module substrate on which the filter component is mounted; and a second inductor that is provided, inside the module substrate, directly below the filter component in plan view and has one end connected to the third terminal and another end connected to ground; wherein the first filter includes a plurality of series arm resonators that are arranged in a series arm that connects an input terminal and an output terminal of the first filter, and a plurality of parallel arm resonators that are connected to the series arm, the one end connected to the first filter of the first inductor is connected to at least one of the plurality of the parallel arm resonators, and a first wiring electrode that defines the first inductor and a second wiring electrode that defines the second inductor are arranged so as to at least partially overlap in plan view.

In the above-described preferred embodiment of the present invention, a portion of an inductor that adjusts the first filter to desired attenuation characteristics is provided in the module substrate as the second inductor. Consequently, the area occupied by the first wiring electrode inside the filter component is able to be reduced by shortening the line length of the first wiring electrode that defines the first inductor that is provided inside the filter component in order to adjust the attenuation characteristics of the first filter. Therefore, since the number of insulating layers is able to be reduced when the first wiring electrode is formed on an insulating layer, the profile of the filter component is able to be reduced. Furthermore, since the second wiring electrode that defines the second inductor is arranged in a region that overlaps the filter component in plan view, the module substrate in which the second wiring electrode is provided is able to be made smaller in terms of the area thereof and consequently the high-frequency module is able to be reduced in size.

Furthermore, since the area occupied by the first wiring electrode inside the filter component is able to be reduced by shortening the line length of the first wiring electrode, electromagnetic-field coupling between another wiring electrode that defines another inductor and so forth and the first wiring electrode located inside the filter component is able to be suppressed. Therefore, variations in the attenuation characteristics of the first filter caused by changes in the characteristics of the first inductor and so forth are able to be prevented.

In addition, the inductance value of the second inductor is able to be freely adjusted by simply changing the pattern shape, line length and thickness of the second wiring electrode inside the module substrate in which there is a higher degree of freedom in terms of arranging wiring electrodes compared with the filter component. Therefore, the degree of freedom in designing a characteristics-adjusting inductor including both the first inductor and the second inductor is able to be increased and as a result the first filter is able to be easily adjusted to desired attenuation characteristics.

In addition, the first wiring electrode and the second wiring electrode are arranged so as to at least partially overlap in plan view and consequently the first inductor and the second inductor are able to be easily made to magnetic field couple with each other. Accordingly, even in the case where the high-frequency module is reduced in size and the space in which the first inductor and the second inductor are able to be arranged is limited, the inductor characteristics of the characteristics-adjusting inductor including both the first inductor and the second inductor can be improved. Therefore, the attenuation characteristics of the first filter are able to be more easily adjusted and improved.

Furthermore, the first wiring electrode and the second wiring electrode are preferably formed and structured such that currents that flow in portions thereof where the first wiring electrode and the second wiring electrode overlap flow in the same direction.

With this configuration, the first wiring electrode and the second wiring electrode are able to be more easily made to magnetic field couple with each other and therefore the inductor characteristics of a characteristics-adjusting inductor including both the first inductor and the second inductor are able to be further improved.

In addition, it is preferable that the first inductor and the second inductor have the same inductor structure of a spiral or helical shape and that the first wiring electrode and the second wiring electrode be wound in the same direction.

With this configuration, the direction of the magnetic field generated by the first inductor and the direction of the magnetic field generated by the second inductor are the same and therefore spreading of the magnetic field generated by the inductor that adjusts the characteristics of the first filter is able to be suppressed. Therefore, for example, magnetic field coupling between the first and second inductors and other circuit elements is able to be prevented.

In addition, it is preferable that the filter component include a filter substrate on which the plurality of series arm resonators and the plurality of parallel arm resonators are provided in a prescribed area of one main surface thereof, and a package substrate on which the filter substrate is mounted, and that the first wiring electrode be provided inside the package substrate.

With this configuration, a high-frequency module having a practical configuration is able to be provided in which a CSP-structure filter component is mounted on the module substrate, the filter component having a low profile as a result of the package substrate, in which the first wiring electrode is provided, being formed so as to be thin.

In addition, the filter component may include a filter substrate on which the plurality of series arm resonators and the plurality of parallel arm resonators are provided in a prescribed area of one main surface thereof, an insulating layer that surrounds the prescribed area, a cover layer that is arranged on the insulating layer and covers the plurality of series arm resonators and the plurality of parallel arm resonators, and a space that is surrounded by the filter substrate, the insulating layer and the cover layer, the first terminal, the second terminal and the third terminal may be exposed at a main surface on a side opposite the surface where the space is located and may be connected to mounting electrodes provided on a mounting surface of the module substrate, and the first wiring electrode may be provided inside the cover layer.

With this configuration, the WL-CSP-structure filter component is mounted on the module substrate, the profile of the filter component having been further reduced as a result of the cover layer, in which the first wiring electrode is provided, being formed so as to be thin. Therefore, a high-frequency module that has been further reduced in profile and size is able to be provided.

Furthermore, it is preferable that the high-frequency module further include a third inductor that adjusts characteristics of the first filter, the third inductor including a third wiring electrode provided inside the module substrate, having one end thereof connected to at least one of the plurality of parallel arm resonators and another end thereof connected to ground, and it is preferable that the second wiring electrode and the third wiring electrode be structured such that directions of currents that flow through the second inductor and the third inductor are opposite to each other.

With this configuration, magnetic field coupling between the second inductor and the third inductor inside the module substrate is suppressed. Therefore, variations in the inductor characteristics of the second inductor and the third inductor are suppressed and consequently the attenuation characteristics of the first filter are able to be improved by preventing degradation of the attenuation characteristics of the first filter.

In addition, it is preferable that the filter component further include a second filter that includes a plurality of resonators and through which an RF signal input to the second terminal passes, and a fourth terminal that outputs the RF signal that has passed through the second filter, a pass band of the first filter being a frequency band of a transmission signal and a pass band of the second filter being a frequency band of a reception signal.

With this configuration, since the attenuation characteristics of the first filter are improved by the first and second inductors, which are arranged so as to be separated from each other, a high-frequency module that includes the first filter and the second filter having improved isolation characteristics is able to be provided.

According to various preferred embodiments of the present invention, the first and second inductors, which adjust the attenuation characteristics of the first filter of the filter component, are separated from each other in a state where the first and second inductors readily magnetic field couple with each other, and consequently the amount of wiring used to define the first wiring electrode inside the filter component is able to be reduced. Therefore, for example, the profile of the filter component is able to be reduced by reducing the number of insulating layers when the first wiring electrode is formed on an insulating layer. Furthermore, since the wiring density of the first wiring electrode inside the filter component is able to be reduced, variations in the attenuation characteristics of the first filter caused by changes in the inductor characteristics of the first inductor due to the first wiring electrode electromagnetic-field coupling with another wiring electrode is able to be prevented. In addition, the inductor characteristics of the characteristics-adjusting inductor including both the first inductor and the second inductor are able to be adjusted by adjusting the inductance value of the second inductor by changing the configuration of the second wiring electrode, and therefore the attenuation characteristics of the first filter are able to be easily adjusted and improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
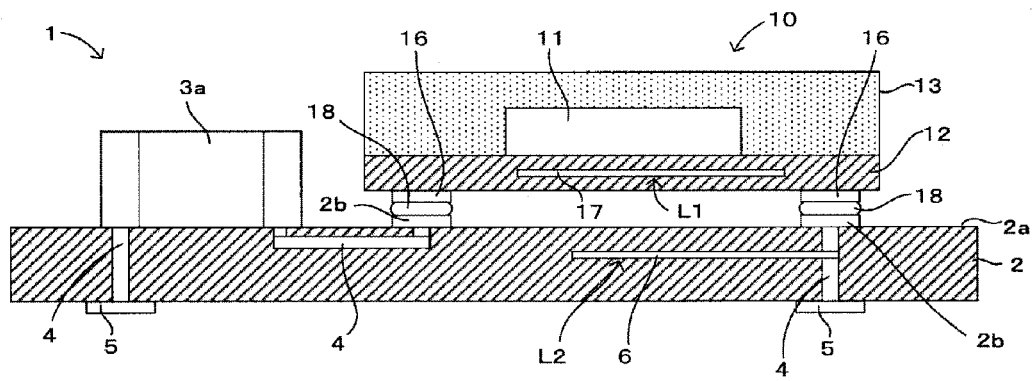
FIG. 1 illustrates a first preferred embodiment of a high-frequency module according to a preferred embodiment of the present invention.
Figure 2:
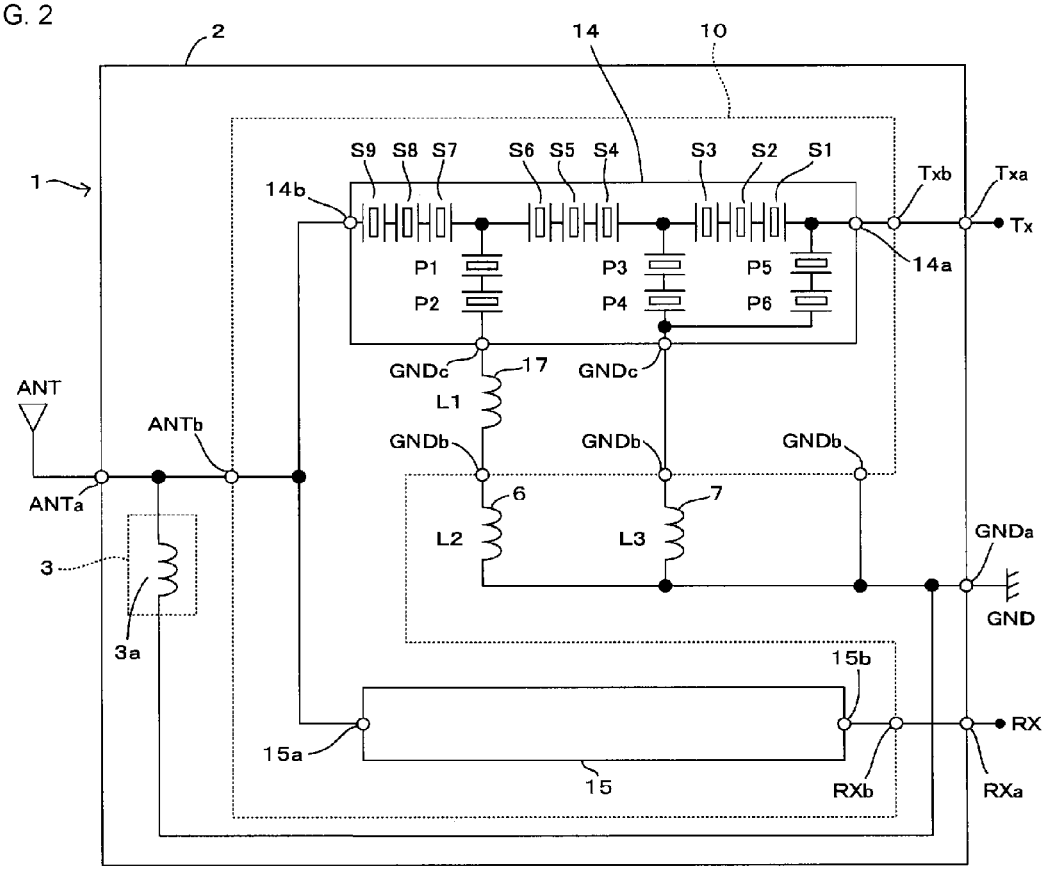
FIG. 2 is a circuit block diagram that illustrates the electrical configuration of the high-frequency module of FIG. 1.
Figure 3:
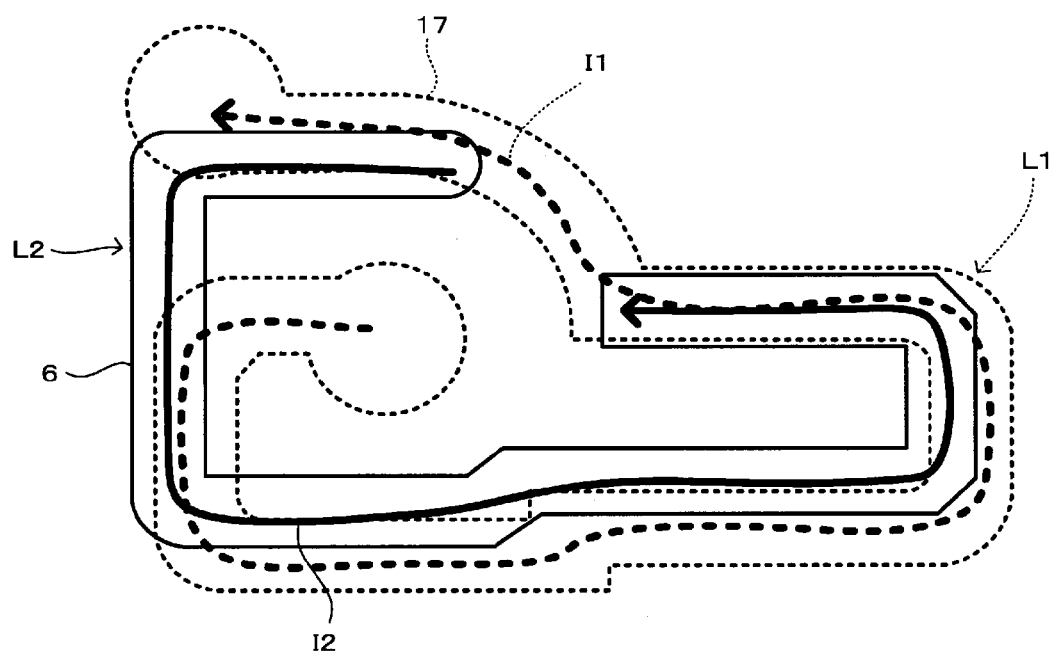
FIG. 3 illustrates the arrangement relationship between a first wiring electrode and a second wiring electrode in plan view.
Figure 4:
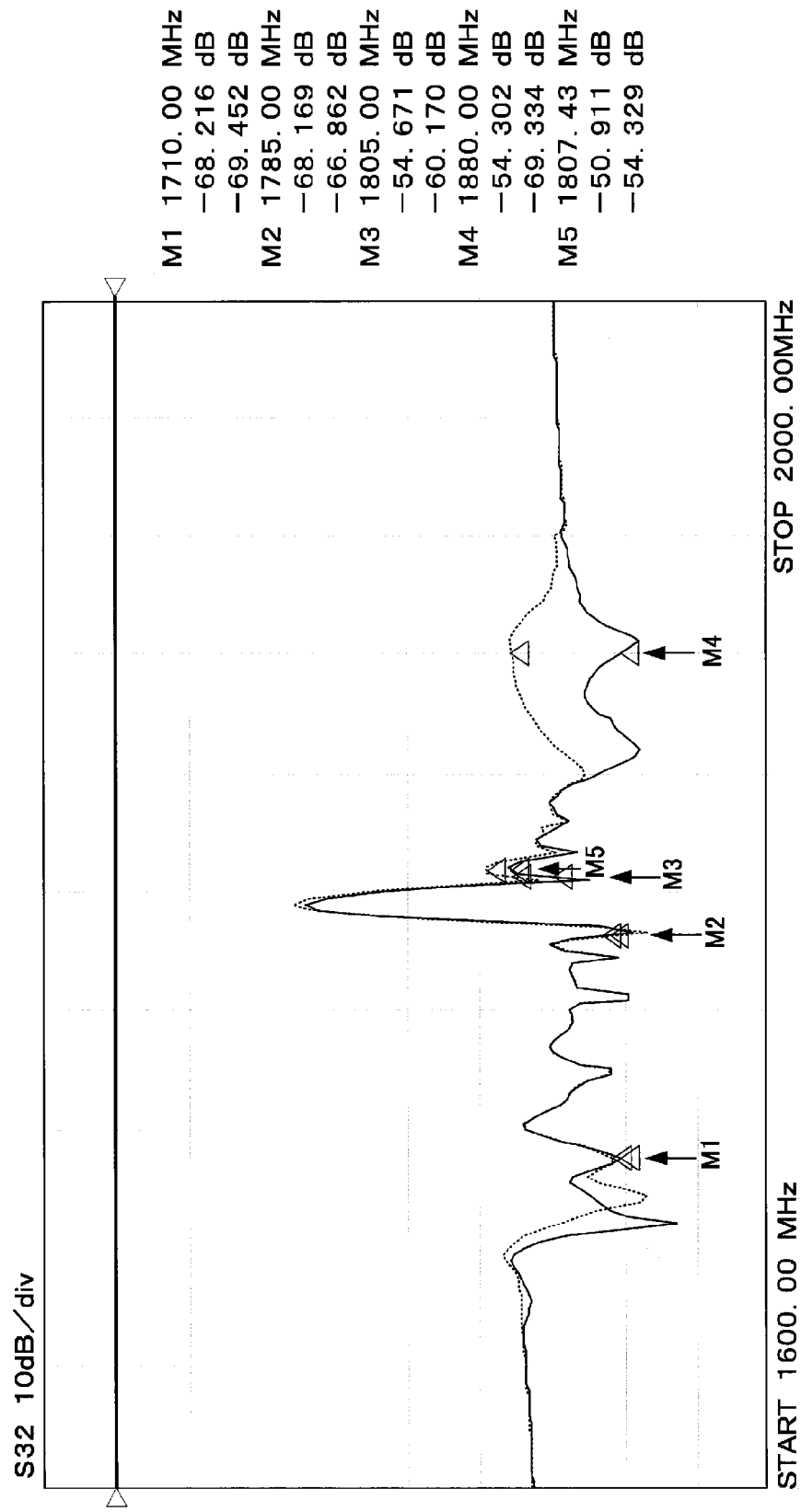
FIG. 4 illustrates the isolation characteristics between a first filter and a second filter.

A first preferred embodiment of a high-frequency module according to a preferred embodiment of the present invention will be described while referring to FIGS. 1 to 5F. FIG. 1 illustrates a high-frequency module according to a preferred embodiment of the present invention, FIG. 2 is a circuit block diagram that illustrates the electrical configuration of the high-frequency module of FIG. 1 and FIG. 3 illustrates the arrangement relationship between a first wiring electrode and a second wiring electrode in plan view. FIG. 4 illustrates the isolation characteristics between a first filter and a second filter. FIGS. 5A-5F illustrate different structural modifications of a wiring electrode of an inductor.

In FIGS. 1 to 3, only important portions of the structures of preferred embodiments of the present invention are illustrated and illustration of other portions of the configuration is omitted in order to simplify the description. Furthermore, in FIG. 6 as well referred to in subsequent description, only the important portions of the structures of preferred embodiments of the present invention are illustrated, as in FIGS. 1 to 3, and description thereof is omitted in the subsequent description.

A high-frequency module 1 illustrated in FIGS. 1 and 2 is to be mounted on a mother substrate of a mobile communication terminal such as a cellular phone or a mobile information terminal, and, in this preferred embodiment, includes a filter component 10 (duplexer) that is provided with a first filter 14 and a second filter 15, a module substrate 2, a matching network 3, and various electronic components (not illustrated) such as switch ICs, filters, resistors, capacitors and coils, and defines a high-frequency antenna switching module.

In addition, the filter component 10, a chip inductor 3a to define the matching network 3 and at least some of the other various electronic components are mounted on mounting electrodes 2b provided on a mounting surface 2a of a module substrate 2. The various components 10 and 3a and electronic components etc. are electrically connected to a plurality of mounting electrodes 5 provided on a rear surface of the module substrate 2 via wiring electrodes 4 provided in the module substrate 2. In addition, a transmission electrode Txa to which a transmission signal is input from the outside, a common electrode ANTa from which a transmission signal input to the transmission electrode Txa is output to the outside and to which a reception signal is input from the outside, a reception electrode Rxa that outputs a reception signal input to the common electrode ANTa to the outside and a ground electrode GNDa that is connected to a ground path GND are defined by the mounting electrodes 5.

Furthermore, wiring electrodes that correspond to various signal paths such as a common path, the ground path, a transmission path and a reception path are provided on the mother substrate of the mobile communication terminal. The high-frequency module 1 is mounted on the mother substrate, and as a result the wiring electrodes that define the various paths, and the common electrode ANTa, the ground electrode GNDa (ground), the transmission electrode Txa and the reception electrode Rxa are connected to each other and transmission and reception signals are input and output between the mother substrate and the high-frequency module 1.

In this preferred embodiment, the module substrate 2 preferably is integrally formed as a ceramic multilayer body by stacking a plurality of dielectric layers formed of ceramic green sheets on top of one another and then firing the stacked dielectric layers.

In addition, the wiring electrodes 4, the mounting electrodes 5, a second wiring electrode 6 that defines a second inductor L2, a third wiring electrode 7 that defines a third inductor L3, and so forth are formed in the module substrate 2 preferably by appropriately forming via conductors and in-plane conductor patterns in and on the dielectric layers. The second and third inductors L2 and L3 adjust the characteristics of the first filter 14. In addition, circuit elements such as other inductors, capacitors and the like may be additionally defined by in-plane conductor patterns and via conductors provided on and in the dielectric layers. Furthermore, various circuits such as a filter circuit and the matching network 3 may be provided by combining such circuit elements. The connection states between the inductors L2 and L3 and the first filter 14 will be described in detail later.

The module substrate 2 may be a multilayer substrate such as a printed substrate, an LTCC, an alumina-based substrate or a composite material substrate using, for example, a resin, a ceramic or a polymer material, and the module substrate 2 preferably is formed by selecting the most suitable material in accordance with the intended use of the high-frequency module 1.

In this preferred embodiment, the matching network 3 preferably includes the chip inductor 3a mounted on the mounting surface 2a of the module substrate 2. Specifically, one end of the inductor 3a is connected to a path that connects a common terminal ANTb (corresponds to "second terminal") of the filter component 10 and the common electrode ANTa of the module substrate 2. The other end of the inductor 3a is connected to the ground electrode GNDa (ground) via a ground connection wiring electrode provided in the module substrate 2, and thus the matching network 3 is provided.

The matching network 3 is not limited to the configuration illustrated in FIG. 2, and the matching network 3 may be formed by replacing the inductor 3a illustrated in FIG. 2 with a capacitor, or the matching network 3 may be formed by connecting an inductor or a capacitor in series to a path that connects the common electrode ANTa and the common terminal ANTb. In addition, the matching network 3 may be formed by using an inductor and a capacitor in combination with each other. That is, the matching network 3 may have any circuit configuration that would be typically used to match the impedances of a circuit element such as an antenna connected to the common electrode ANTa and the filter component 10 connected to the common terminal ANTb in the high-frequency module 1. In addition, matching networks 3 may be additionally provided on the side of a transmission terminal Txb and a reception terminal Txb.

The filter component 10 preferably has a chip size package (CSP) structure and includes a filter substrate 11 on which the first filter 14 and the second filter 15 are provided in a prescribed area of one main surface thereof, a package substrate 12 on which the filter substrate 11 is mounted, a resin layer 13 that is provided on the package substrate 12 so as to cover the filter substrate 11, a transmission terminal Txb (corresponding to "first terminal"), a common terminal ANTb, a reception terminal Rxb (corresponding to "fourth terminal") and a plurality of ground terminals GNDb (corresponding to "third terminal").

In addition, a transmission signal is input to the transmission terminal Txb from the transmission electrode Txa, and the transmission signal is output to the common electrode ANTa from the common terminal ANTb via the first filter 14. Furthermore, a reception signal is input to the common terminal ANTb from the common electrode ANTa and the reception signal is output to the reception electrode Rxa from the reception terminal Rxb via the second filter 15.

The filter substrate 11 is preferably made of a piezoelectric material such as lithium niobate, lithium tantalate or a crystal in this preferred embodiment. In addition, the first filter 14 and the second filter 15 are formed on the filter substrate 11 preferably by forming surface acoustic wave (SAW) filter elements by providing comb-tooth electrodes (IDT electrodes) and reflectors formed of Al, Cu or the like in a prescribed area on one main surface of the filter substrate 11.

Furthermore, an input terminal 14a and an output terminal 14b of the first filter 14, an input terminal 15a and an output terminal 15b of the second filter 15 and ground wiring outside connection terminals GNDc are provided on the filter substrate 11.

In this preferred embodiment, the package substrate 12 preferably is integrally formed as a ceramic multilayer body by stacking a plurality of dielectric layers formed of ceramic green sheets on top of one another and then firing the stacked dielectric layers, similarly to the module substrate 2. In addition, similarly to as the module substrate 2, via conductors and in-plane conductor patterns are appropriately formed in and on the dielectric layers, such that inner wiring electrodes (not illustrated), mounting electrodes 16 and a first wiring electrode 17 that defines a first inductor L1 are provided in the package substrate 12. The transmission terminal Txb, the common terminal ANTb, the reception terminal Rxb and the ground terminals GNDb are defined by the mounting electrodes 16. In addition, the first inductor L1 adjusts the characteristics of the first filter 14.

The package substrate 12 may be a multilayer substrate such as a printed substrate, an LTCC, an alumina-based substrate or a composite material substrate using, for example, a resin, a ceramic or a polymer material, and the package substrate 12 preferably is formed by selecting the most suitable material in accordance with the intended use of the high-frequency module 1.

The filter substrate 11 is connected to mounting electrodes (not illustrated) located on the surface of the package substrate 12 by using bonding wires (not illustrated) or ultrasound vibration and is thus mounted on the package substrate 12. Thus, through inner wiring electrodes, which are not illustrated, the input terminal 14a of the first filter 14 and the transmission terminal Txb are connected to each other, the output terminal 15b of the second filter 15 and the reception terminal Rxb are connected to each other, and the output terminal 14b of the first filter 14, the input terminal 15a of the second filter 15 and the common terminal ANTb are connected to each other. Furthermore, the outside connection terminals GNDc and the ground terminals GNDb are directly connected to each other using an inner wiring electrodes or are connected to each other via the first inductor L1 (first wiring electrode 17).

The resin layer 13 is formed on the package substrate 12 using a typical thermally curable sealing resin such as epoxy resin so as to cover the filter substrate 11. The filter component 10 is connected to the mounting electrodes 2b on the mounting surface 2a of the module substrate 2 via solder balls 18 provided on the mounting electrodes 16.

The configurations of the first filter 14 and the second filter 15 will be described next. The frequency band of a transmission signal is set as the pass band of the first filter 14 and the frequency band of a reception signal, which is different to the frequency band of the transmission signal, is set as the pass band of the second filter 15.

As illustrated in FIG. 2, the first filter 14 is located in a prescribed area on the one main surface of the filter substrate 11 by connecting a plurality of SAW resonators, which include comb-tooth electrodes and reflectors, in a ladder configuration. Specifically, the first filter 14 includes a plurality of resonators S1 to S9 (for example, nine in this preferred embodiment) that are arranged in a series arm that connects the input terminal 14a and the output terminal 14b, and a plurality of parallel arm resonators P1 to P6 (for example, six in this preferred embodiment) connected between the series arm and the ground wiring outside connection terminals GNDc (ground terminals GNDb).

Furthermore, one end of the parallel arm resonator P1 is connected between the series arm resonators S6 and S7 and the other end of the parallel arm resonator P1 is connected to one end of the parallel arm resonator P2. In addition, the other end of the parallel arm resonator P2 is connected to a ground wiring outside connection terminal GNDc. One end of the inductor L1, which is provided inside the package substrate 2, is connected to the other end of the parallel arm resonator P2 (first filter 14) via an outside connection terminal GNDc and the other end of the inductor L1 is connected to a ground terminal GNDb. In addition, one end of the inductor L2 is connected to a ground terminal GNDb and is connected to the other end of the first inductor L1, and the other end of the inductor L2 is connected to the ground electrode GNDa, such that the parallel arm resonators P1 and P2 are connected to the ground electrode GNDa (ground).

Furthermore, one end of the parallel arm resonator P3 is connected between the series arm resonators S3 and S4 and the other end of the parallel arm resonator P3 is connected to one end of the parallel arm resonator P4. One end of the parallel arm resonator P5 is connected between the series arm resonator S1 and the input terminal 14a and the other end of the parallel arm resonator P5 is connected to one end of the parallel arm resonator P6. The other ends of the parallel arm resonators P4 and P6 are connected to a ground terminal GNDb via a ground wiring outside connection terminal GNDc. One end of the inductor L3 is connected to the other ends of the parallel arm resonators P4 and P6 (first filter 14) via the ground terminal GNDb and the other end of the inductor L3 is connected to the ground electrode GNDa (ground), such that the parallel arm resonators P3 to P6 are connected to the ground electrode GNDa (ground).

In addition, the attenuation characteristics of the first filter 14 are able to be adjusted by appropriately adjusting the inductance values of the inductors L1 to L3. Specifically, an attenuation pole is able to be generated at the position of an arbitrary frequency on the low-frequency side or the high-frequency side of the pass band of the first filter 14 by adjusting the inductance values of the inductors L1 to L3. Furthermore, the resonators S1 to S9 and P1 to P6 are preferably provided by arranging reflectors at both sides of the comb-tooth electrodes in the propagation direction of surface acoustic waves, and the resonators S1 to S9 and P1 to P6 are connected to the ground electrode GNDa (ground) by being connected to the ground terminals GNDb via inner wiring electrodes, which are not illustrated, inside the filter component 10.

A reception SAW filter element of the second filter 15 outputs a reception signal of a second frequency band, which is input from the common terminal ANTb, to the reception terminal Rxb. In addition, as illustrated in FIG. 2, the second filter 15 is provided in a prescribed area on the one main surface of the filter substrate 11 by connecting a plurality of resonators, which each include comb-tooth electrodes and reflectors, to each other. Furthermore, the second filter 15 is provided by serially connecting a resonator that defines a phase shifter and longitudinally-coupled-type resonators that form a band pass filter, for example. The detail explanation is omitted. In addition, similarly to as in the first filter 14 described above, the resonators that form the second filter 15 are connected to the ground electrode GNDa (ground) via inner wiring electrodes, which are not illustrated, inside the filter component 10 and the ground terminals GNDb.

The second filter 15 may be a balanced filter in which two reception terminals Rxb are provided and a reception signal is output in a balanced manner.

In this preferred embodiment, the first to third inductors L1 to L3, which adjust the characteristics of the first filter 14 of the filter component 10, are provided. The first inductor L1 is defined by the first wiring electrode 17 formed in the package substrate 12. The second and third inductors L2 and L3 are defined by the second and third wiring electrodes 6 and 7 provided in the module substrate 2. In addition, in this preferred embodiment, as illustrated in FIG. 1, the second wiring electrode 6, which defines the second inductor L2, is arranged, inside the module substrate 2, directly below the filter component 10 in plan view and a shielding ground electrode is not arranged between the filter component 10 and the second inductor L2.

Furthermore, the first inductor L1 and the second inductor L2 are connected in series with each other via a ground terminal GNDb. In addition, as illustrated in FIGS. 1 and 3, the first wiring electrode 17, which defines the first inductor L1, and the second wiring electrode 6, which defines the second inductor L2, are arranged so as to at least partially overlap in plan view. It is preferable that the first wiring electrode 17 and the second wiring electrode 6 overlap as much as possible in plan view. Furthermore, in this preferred embodiment, the first wiring electrode 17 and the second wiring electrode 6 are structured such that a current I1 that flows through the first wiring electrode 17 and a current I2 that flows through the second wiring electrode 6 flow in the same direction in portions of the electrodes where the first wiring electrode 17 and the second wiring electrode 6 overlap.

Specifically, the first inductor L1 and the second inductor L2 are defined by the first wiring electrode 17 and the second wiring electrode 6, which preferably include a spiral or helical inductor structure. In addition, the first wiring electrode 17 and the second wiring electrode 6 are wound in the same direction.

Furthermore, the third wiring electrode 7, which defines the third inductor L3, is provided inside the module substrate 2. In this preferred embodiment, the second wiring electrode 6 and the third wiring electrode 7 are structured such that the directions of currents that flow through the second inductor L2 and the third inductor L3 are opposite to each other. It is preferable that the distance between the third wiring electrode 7 and the second wiring electrode 6 be longer than the distance between the first wiring electrode 17 and the second wiring electrode 6.

Next, an outline of an example of a method of manufacturing the high-frequency module 1 of FIG. 1 will be described.

First, ceramic green sheets for forming the dielectric layers that will form the module substrate 2 are prepared as follows. Via conductors (wiring electrodes 4, 6 and 7) that provide connections between layers are formed by forming via holes, using for example a laser, in ceramic green sheets that have been formed in a predetermined shape, then filling the insides of the via holes with a conductive paste and then performing via fill plating, and, then, wiring patterns such as in-plane conductor patterns (wiring electrodes 4, 6 and 7), the mounting electrodes 2b on the mounting surface 2a and the mounting electrodes 5 are formed by performing printing using a conductive paste. A plurality of via conductors and in-plane conductor patterns are provided on and in the ceramic green sheets so that it is possible to form a large number of module substrates 2 in one step/process.

Next, the dielectric layers are stacked on top of one another to form a multilayer body. Grooves, which will be used to divide the multilayer body into individual module substrates 2 after firing, are formed so as to surround the regions corresponding to the individual module substrates 2. Next, formation of an agglomeration of module substrates 2 is completed by subjecting the multilayer body to low-temperature firing.

Next, before dividing the agglomeration into individual module substrates 2, various electronic components such as the filter component 10 and the inductor 3a are mounted on the mounting surfaces 2a of the agglomeration of module substrates 2 and manufacture of the agglomeration of module substrate 2, such that the agglomeration of the high-frequency module 1 is complete. In addition, at this time, a resin layer may be provided by applying a resin onto the mounting surfaces 2a of the agglomeration of module substrates 2 so as to cover the filter components 10 and the inductors 3a and then thermally curing the resin. After that, the agglomeration of high-frequency modules 1 is divided into individual high-frequency modules 1 and manufacture of the high-frequency module 1 is complete.

In the thus-formed high-frequency module 1, a transmission signal output to the transmission terminal Txb of the filter component 10 via a mounting electrode 5 and a wiring electrode 4 from the mother substrate is input to the first filter 14, undergoes prescribed filter processing, is output to the module substrate 2 from the common terminal ANTb and is output to the outside via a wiring electrode 4 (matching network 3) and a mounting electrode 5. Furthermore, a reception signal input from the outside to the common terminal ANTb of the filter component 10 via a mounting electrode 5 and a wiring electrode 4 (matching network 3) is input to the second filter 15, undergoes prescribed filter processing, is output to the module substrate 2 from the reception terminal Rxb and is output to the outside via a wiring electrode 4 and a mounting electrode 5.

Next, the isolation characteristics of the high-frequency module 1 will be described. The isolation characteristics illustrated in FIG. 4 indicate the magnitude of an RF signal measured at the reception electrode Rxa (reception terminal Rxb) when an RF signal of an arbitrary frequency is input to the transmission electrode Txa (transmission terminal Txb). The horizontal axis in FIG. 4 represents the frequency (MHz) of the RF signal input to the transmission electrode Txa and the vertical axis in FIG. 4 represents the signal level (dB) of the RF signal measured at the reception electrode Rxb.

Furthermore, the solid line in FIG. 4 represents isolation characteristics obtained when a prescribed RF signal is input to the high-frequency module 1 in which the second inductor L2, which is serially connected to the first inductor L1, is provided inside the module substrate 2 as described above, and the dotted line in the same figure represents isolation characteristics obtained when a prescribed RF signal is input to a high-frequency module that is not equipped with the second inductor L2, as a comparative example.

As illustrated in FIG. 4, in the practical example of this application, in particular, the isolation characteristics in the frequency band of the reception signal set on the high-frequency side (M4 band in this example) are improved by around 3.4 dB when compared with the comparative example.

Modifications of the wiring electrodes 6, 7 and 17 that define the inductors L1 to L3 provided inside the module substrate 2 and the inductor component 10 will be described while referring to FIGS. 5A-5F. FIGS. 5A-5F illustrate different structure modifications of a wiring electrode that defines an inductor. The wiring electrodes described hereafter are to be provided on an insulating layer included in the module substrate 2 or the package substrate 12 and the inductors L1 to L3 may be provided by combining the wiring electrodes described hereafter in any manner in accordance with the characteristics required for the inductors.

Figure 5A:
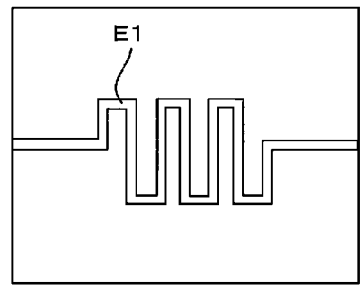
FIGS. 5A-5F illustrate different structural modifications of a wiring electrode that defines an inductor.
Figure 5B:
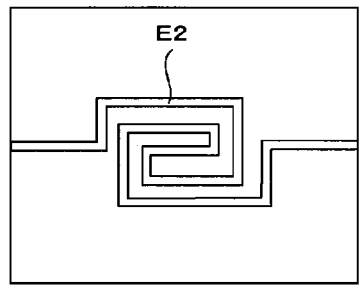
Figure 5C:
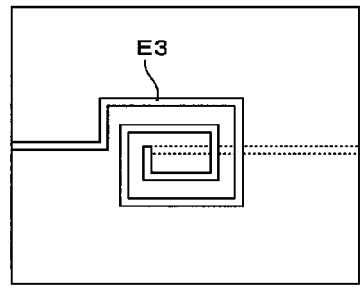
Figure 5D:
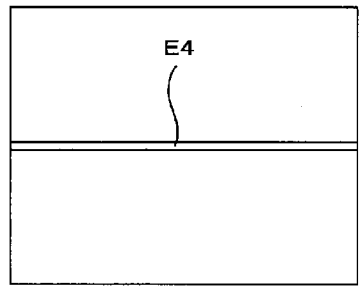

A wiring electrode E1 illustrated in FIG. 5A preferably has a meandering shape and a wiring electrode E2 illustrated in FIG. 5B preferably has a spiral shape. In addition, a wiring electrode E3 illustrated in FIG. 5C preferably has a spiral shape, and one lead-out electrode (dotted line portion in the same figure) is provided on a different insulating layer to the main portion of the wiring electrode E3 and is connected to the main portion of the wiring electrode E3 with a via conductor. Furthermore, a wiring electrode E4 illustrated in FIG. 5D preferably has a straight-line shape.

Figure 5E:
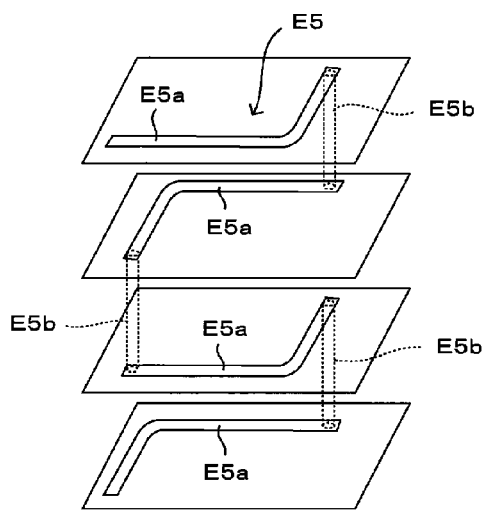

In addition, a wiring electrode E5 illustrated in FIG. 5E includes a plurality of substantially L-shaped in-plane conductor patterns E5a that are respectively provided on a plurality of insulating layers. Furthermore, the substantially L-shaped in-plane conductor patterns E5a at the first and third layer from the top are arranged with the same orientation and the substantially L-shaped in-plane conductor patterns E5a at the second and fourth layer from the top are arranged with orientations that are obtained by rotating the first and third in-plane conductor patterns E5a through approximately 180°. A first end of the first in-plane conductor pattern E5a on the short side and a second end of the second in-plane conductor pattern E5a on the long side are connected to each other by a via conductor E5b, a first end of the second in-plane conductor pattern E5a on the short side and a second end of the third in-plane conductor pattern E5a on the long side are connected to each other by a via conductor E5b, and a first end of the third in-plane conductor pattern on the short side and a second end of the fourth in-plane conductor pattern E5a on the long side are connected to each other by a via conductor E5b, such that the spiral-shaped wiring electrode E5 is provided.

Figure 5F:
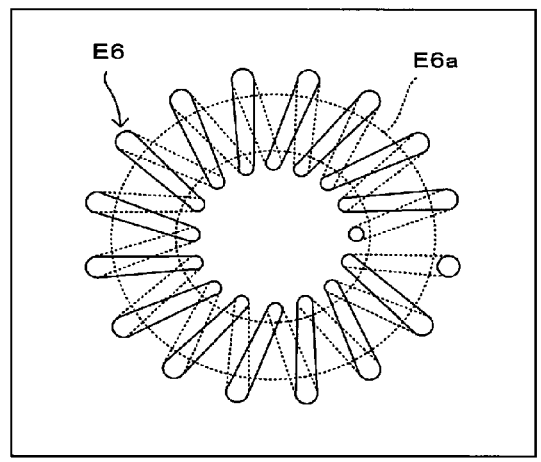

In addition, a wiring electrode E6 illustrated in FIG. 5F has a shape that winds around an annular toroidal coil core E6a in a spiral shape.

As described above, in this preferred embodiment, one of the inductors that adjust the first filter 14 of the filter component 10 to desired attenuation characteristics is provided in the module substrate 2 as the second inductor L2. Consequently, the area occupied by the first wiring electrode 17 inside the filter component is able to be reduced by shortening the line length of the first wiring electrode 17 that defines the first inductor L1 that is provided inside the filter component 10 in order to adjust the attenuation characteristics of the first filter 14. Therefore, since the number of insulating layers is able to be reduced when the first wiring electrode 17 is formed on an insulating layer of the package substrate 12, the profile of the filter component 10 is able to be reduced. Furthermore, the second wiring electrode 6, which defines the second inductor L2, may be arranged in an area that overlaps the filter component 10 in plan view due to the second inductor L2 being arranged directly below the filter component 10. Therefore, the high-frequency module 1 is able to be reduced in size by reducing the area of the module substrate 2 in which the second wiring electrode 6 is located.

Furthermore, since the area occupied by the first wiring electrode 17 inside the filter component 10 can be reduced by shortening the line length of the first wiring electrode 17, electromagnetic-field coupling between other wiring electrodes that define other inductors and so forth and the first wiring electrode 17 arranged inside the filter component 10 is able to be suppressed. Therefore, variations in the attenuation characteristics of the first filter 14 caused by changes in the device characteristics of the first inductor L1 and so forth are able to be prevented.

Furthermore, the inductance value of the second inductor L2 is able to be freely adjusted by simply changing the pattern shape, line length and thickness of the second wiring electrode 6 inside the module substrate 2, in which it is easier to secure space in which to arrange wiring electrodes compared with the filter component 10. Therefore, the degree of freedom in designing a characteristics-adjusting inductor including both the first inductor L1 and the second inductor L2 is able to be increased and as a result the first filter 14 is able to be easily adjusted to desired attenuation characteristics.

In addition, the first wiring electrode 17 and the second wiring electrode 6 at least partially overlap in plan view and consequently, the first inductor L1 and the second inductor L2 is able to be easily made to magnetic field couple with each other. Accordingly, even in the case where the high-frequency module 1 is reduced in size and the space in which the first inductor L1 and the second inductor L2 are able to be arranged is limited, the inductor characteristics of the characteristics-adjusting inductor including both the first inductor L1 and the second inductor L2 are able to be improved. Therefore, the attenuation characteristics of the first filter 14 are able to be more easily adjusted and improved.

Furthermore, since the first wiring electrode 17 and the second wiring electrode 6 are structured such that currents flow in the same direction in portions of the electrodes where the first wiring electrode 17 and the second wiring electrode 6 overlap, the first wiring electrode 17 and the second wiring electrode 6 are able to be more easily made to magnetic field couple with each other. Therefore, the inductor characteristics of the characteristics-adjusting inductor including both the first inductor L1 and the second inductor L2 are able to be further improved. In addition, in this preferred embodiment, since a shielding ground electrode is not arranged between the filter component 10 and the second inductor L2, magnetic flux generated by the inductors L1 and L2 is not obstructed and therefore the inductor characteristics of the characteristics-adjusting inductor including both the first inductor L1 and the second inductor L2 are able to be still further improved.

Furthermore, as a result of the first inductor L1 and the second inductor L2 including the first wiring electrode 17 and the second wiring electrode 6 that are provided with the same inductor structure having a spiral or helical shape and the first wiring electrode 17 and the second wiring electrode 6 being wound in the same direction, the following effect is realized. That is, the direction of the magnetic field generated by the first inductor L1 and the direction of the magnetic field generated by the second inductor L2 are the same and therefore spreading of the magnetic field generated by the inductor to adjust the characteristics of the first filter 14 is able to be suppressed. Therefore, for example, magnetic field coupling between the first and second inductors L1 and L2 and other circuit elements is able to be prevented.

In addition, the high-frequency module 1 is able to be provided that has a practical configuration in which the CSP-structure filter component 10 is mounted on the module substrate 2, the filter component 10 having a low profile as a result of it being possible to form the package substrate 12, in which the first wiring electrode 17 is provided, so as to be thin.

Furthermore, the second wiring electrode 6 and the third wiring electrode 7 are structured such that currents flow in opposite directions through the second inductor L2 and the third inductor L3 and therefore magnetic field coupling of the second inductor L2 and the third inductor L3 inside the module substrate is suppressed. Therefore, variations in the inductor characteristics of the second inductor L2 and the third inductor L3 are suppressed and therefore the attenuation characteristics of the first filter 14 are able to be improved by preventing degradation of the attenuation characteristics of the first filter 14.

Furthermore, since the attenuation characteristics of the first filter 14 are improved by the first and second inductors L1 and L2, which are arranged so as to be separated from each other, the high-frequency module 1 is able to be provided that includes the first filter 14 and the second filter 15 having improved isolation characteristics.

Second Preferred Embodiment

Figure 6:
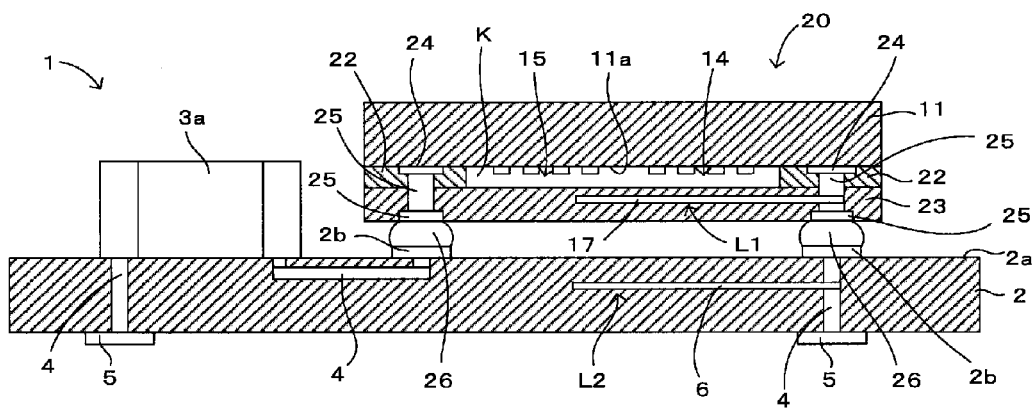
FIG. 6 illustrates a second preferred embodiment of a high-frequency module according to a preferred embodiment of the present invention.
Figure 7:
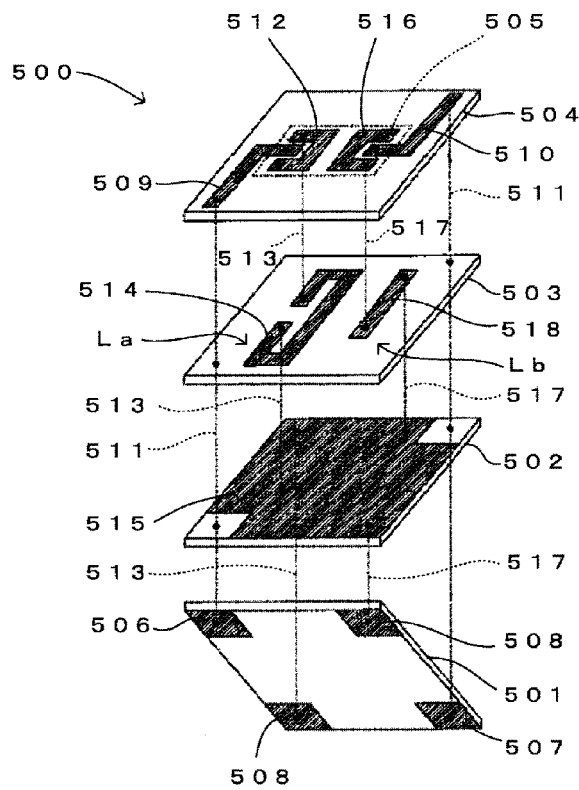
FIG. 7 illustrates a package substrate of a filter component included in a high-frequency module of the related art.

Next, a second preferred embodiment of the present invention will be described while referring to FIG. 6. FIG. 6 illustrates a second preferred embodiment of a high-frequency module according to a preferred embodiment of the present invention.

This preferred embodiment differs from the first preferred embodiment described above in that, as illustrated in FIG. 6, a filter component 20 preferably has a wafer level chip size package (WL-CSP) structure and the first wiring electrode 17 that defines the first inductor L1 is provided in a cover layer 23. Other portions of the configuration are the same as in the first preferred embodiment described above and therefore the same symbols are used and description thereof is omitted.

The filter component 20 includes the filter substrate 11, an insulating layer 22, the cover layer 23, the first filter 14 and the second filter 15.

In this preferred embodiment, the first filter 14 and the second filter 15 are formed by constructing surface acoustic wave (SAW) resonators by providing comb-tooth electrodes (IDT electrodes) and reflectors formed of Al, Cu or the like in a prescribed area on one main surface 11a of the filter substrate 11, similarly to as in the above-described first preferred embodiment. Furthermore, the input terminal 14a and the output terminal 14b of the first filter 14, the input terminal 15a and the output terminal 15b of the second filter 15 and terminal electrodes 24 that define the ground wiring outside connection terminals GNDc are provided on the one main surface 11a of the filter substrate 11.

Then, electrodes 25, which penetrate through the insulating layer 22, are connected to the terminal electrodes 24 and the transmission terminal Txb, the reception terminal Rxb, the common terminal ANTb and a plurality of ground terminals GNDb are defined by the electrodes 25, which are exposed from a main surface of the cover layer 23. The input terminal 14a of the first filter 14 and the transmission terminal Txb are connected to each other, the output terminal 15b of the second filter 15 and the reception terminal Rxb are connected to each other, and the output terminal 14b of the first filter 14, the input terminal 15a of the second filter 15 and the common terminal ANTb are connected to each other. In addition, the SAW resonators are connected to the ground terminals GNDb via ground wiring ground terminals GNDc.

The insulating layer 22 surrounds a prescribed area of the one main surface 11a of the filter substrate 11, comb-tooth electrodes and reflectors being provided in the prescribed area. Specifically, the insulating layer 22 is provided preferably by forming a resin layer using a photosensitive epoxy-based resin or polyimide-based resin on the one main surface 11a of the filter substrate 11, on which the comb-tooth electrodes, reflectors and terminal electrodes 24 are provided, and then removing the resin layer from the prescribed area in which the comb-tooth electrodes and reflectors are provided and from the regions in which the terminal electrodes 24 are provided through a photolithography process.

The cover layer 23 is arranged on the insulating layer 22 and defines, together with insulating layer 22, an enclosed space K between the cover layer 23 and the filter substrate 11, and a transmission SAW filter element and a reception SAW filter element are arranged inside the space K. Specifically, for example, the cover layer 23 is provided preferably by forming the electrodes 25 that are connected to the terminal electrodes 24 by charging a Cu or Al paste into connection holes in resin layers stacked on the insulating layer 22 and performing via fill plating through a photolithography process using a photosensitive epoxy-based resin or polyimide-based resin. Furthermore, in this preferred embodiment, the first wiring electrode 17, which defines the first inductor L1, is provided in or on the cover layer 23. Then, mounting solder balls 26 are formed on the electrodes 25, which are connected to the terminal electrodes 24 and are exposed from the main surface of the cover layer 23 on the side opposite the space in which the filter elements are arranged, and formation of the filter component 20 is thus completed.

In addition, the filter component 20 is connected to the mounting electrodes 2b on the mounting surface 2a such that the cover layer 23 faces the mounting surface 2a of the module substrate 2, such that the transmission electrode Txa of the module substrate 2 and the transmission terminal Txb of the filter component 20 are connected to each other and the transmission electrode Txa and the input terminal 14a of the first filter 14 are connected each other via the transmission terminal Txb. Furthermore, the reception electrode Rxa of the module substrate 2 and the reception terminal Rxb of the filter component 20 are connected to each other and the reception electrode Rxa and the output terminal 15b of the second filter 15 are connected to each other via the reception terminal Rxb. In addition, the common electrode ANTa of the module substrate 2 and the common terminal ANTb of the filter component 20 are connected to each other and the common electrode ANTa, the output terminal 14b of the first filter 14 and the input terminal 15a of the second filter 15 are connected to each other via the common terminal ANTb. In addition, the ground electrode GNDa of the module substrate 2 and the ground terminals GNDb of the filter component 20 are connected to each other and the ground electrode GNDa and grounding points of the filters 14 and 15 are connected to each other via the ground terminals GNDb.

As described above, in this preferred embodiment, a circuit that is similar to the circuit illustrated in FIG. 2 is provided and the following effect is able to be achieved. That is, the WL-CSP-structure filter component 20 is mounted on the module substrate 2, the filter component 20 having undergone further profile reduction as a result of the cover layer 23, in which the first wiring electrode 17 is provided, being formed so as to be thin. Therefore, the high-frequency module 1, which has been further reduced in profile and size, is able to be provided.

In addition, the present invention is not limited to the above-described preferred embodiments and various modifications not described above can be made so long as they do not deviate from the gist of the present invention and the configurations of the above-described preferred embodiments may be combined with each other in any manner. For example, one end of the first inductor L1 may be connected to another parallel arm resonator. In addition, a plurality of first inductors L1 may be provided and each first inductor L1 may be connected to a different parallel arm resonator.

Furthermore, the configuration of a ladder filter that includes the first filter 14 is not limited to the example described above and the first filter 14 may be formed in any manner so long as the configuration of the ladder filter is a configuration that includes a shunt-connected resonator in order to adjust the filter characteristics. In addition, the configuration of the second filter 15 may include a resonator that utilizes elastic waves and the second filter 15 may be defined by a typical LC filter. Furthermore, not limited to SAW filters, the first filter 14 and the second filter 15 may be defined by FBAR or SMR BAW filters that utilize bulk elastic waves as filters that utilize elastic waves.

In addition, in the above-described preferred embodiments, a high-frequency module 1 in which a single filter component 10 or 20 is mounted on a module substrate 2 is described as an example, but a high-frequency module may be provided by mounting two or more filter components 10 or 20 on a module substrate 2, and in such a case a switch IC may be mounted on the module substrate 2 and the filter components 10 and 20 to be used may be selectively switched between by the switch IC among the plurality of filter components 10 or 20 mounted on the module substrate 2.

Furthermore, a ground electrode layer may be further provided on the mounting surface 2a of the module substrate 2. In this case, a notch may be provided in the ground electrode layer in a portion where the first wiring electrode 17 and the second wiring electrode 6 overlap in plan view.

Preferred embodiments and modifications thereof of the present invention may be broadly applied to high-frequency modules that include a module substrate on which a filter component is mounted.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A high-frequency module comprising:
a filter component including:
 a first terminal to which an RF signal is input;
 a first filter through which the RF signal input to the first terminal passes;
 a second terminal that outputs the RF signal that has passed through the first filter;
 a third terminal; and
 a first inductor including one end connected to the first filter and another end connected to the third terminal;

a module substrate on which the filter component is mounted; and a second inductor that is provided, inside the module substrate, directly below the filter component in plan view and includes one end connected to the third terminal and another end connected to ground; wherein the first filter includes:
a plurality of series arm resonators that are arranged in a series arm that connects an input terminal and an output terminal of the first filter; and
a plurality of parallel arm resonators that are connected to the series arm; wherein
the one end connected to the first filter of the first inductor is connected to at least one of the plurality of the parallel arm resonators; and
a first wiring electrode that defines the first inductor and a second wiring electrode that defines the second inductor at least partially overlap in plan view.

2. The high-frequency module according to claim 1, wherein the first wiring electrode and the second wiring electrode are structured such that currents that flow in portions thereof where the first wiring electrode and the second wiring electrode overlap flow in a same direction.

3. The high-frequency module according to claim 1, wherein the first inductor and the second inductor have a same inductor structure of a spiral or helical shape and the first wiring electrode and the second wiring electrode are wound in a same direction.

4. The high-frequency module according to claim 1, wherein
the filter component includes a filter substrate on which the plurality of series arm resonators and the plurality of parallel arm resonators are located in a prescribed area of one main surface thereof, and a package substrate on which the filter substrate is mounted; and
the first wiring electrode is provided inside the package substrate.

5. The high-frequency module according to claim 4, further comprising a resin layer provided on the package substrate.

6. The high-frequency module according to claim 4, wherein the first wiring electrode is provided in the package substrate, and the second wiring electrode is provided in the module substrate.

7. The high-frequency module according to claim 1, wherein the filter component includes:
a filter substrate on which the plurality of series arm resonators and the plurality of parallel arm resonators are located in a prescribed area of one main surface thereof;
an insulating layer that surrounds the prescribed area;
a cover layer that is arranged on the insulating layer and covers the plurality of series arm resonators and the plurality of parallel arm resonators; and
a space that is surrounded by the filter substrate, the insulating layer and the cover layer;
the first terminal, the second terminal and the third terminal are exposed at a main surface on a side opposite the surface where the space is located and are connected to mounting electrodes provided on a mounting surface of the module substrate; and
the first wiring electrode is provided inside the cover layer.

8. The high-frequency module according to claim 1, further comprising:
a third inductor that adjusts characteristics of the first filter, the third inductor including a third wiring electrode provided inside the module substrate, including one end thereof connected to at least one of the plurality of parallel arm resonators and another end thereof connected to ground; wherein
the second wiring electrode and the third wiring electrode are structured such that directions of currents that flow through the second inductor and the third inductor are opposite to each other.

9. The high-frequency module according to claim 1, wherein
the filter component further includes:
a second filter including a plurality of resonators and through which an RF signal input to the second terminal passes; and
a fourth terminal that outputs the RF signal that has passed through the second filter; wherein
a pass band of the first filter is a frequency band of a transmission signal; and
a pass band of the second filter is a frequency band of a reception signal.

10. The high-frequency module according to claim 9 wherein the second filter is a balanced filter.

11. The high-frequency module according to claim 1, wherein the filter component is a duplexer.

12. The high-frequency module according to claim 1, wherein the high-frequency module is a high-frequency antenna switching module.

13. The high-frequency module according to claim 1, wherein the module substrate includes a multilayer body.

14. The high-frequency module according to claim 13, wherein the multilayer body includes via conductors and in-plane conductor patterns.

15. The high-frequency module according to claim 1, further comprising a matching network including at least one of an inductor and a capacitor.

16. The high-frequency module according to claim 1, wherein the filter component has one of a chip size package structure and a wafer level chip size package structure.

17. The high-frequency module according to claim 1, wherein the first filter includes a plurality of surface acoustic wave resonators.

18. The high-frequency module according to claim 1, further comprising a ground electrode layer on a mounting surface of the module substrate, wherein the ground electrode layer includes a notch at a location where the first and second wiring electrodes at least partially overlap in plan view.

19. A mobile communication terminal comprising:
a mother substrate; and
the high-frequency module according to claim 1 mounted on the mother substrate.

20. The mobile communication terminal according to claim 19, wherein the mobile communication terminal is one of a cellular phone and a mobile information terminal.

* * * * *